United States Patent [19]

Andrews, II et al.

[11] Patent Number: 4,575,762

[45] Date of Patent: Mar. 11, 1986

[54] INTEGRATED PROCESSOR BOARD ASSEMBLY

[75] Inventors: Austin M. Andrews, II, Brea; Edwin E. Barrowcliff, El Toro, both of Calif.

[73] Assignee: Rockwell International Corporation, El Segundo, Calif.

[21] Appl. No.: 531,107

[22] Filed: Sep. 12, 1983

[51] Int. Cl.$^4$ .......................... H04N 5/30; H01L 31/00
[52] U.S. Cl. ........................................ 358/209; 357/24; 357/30
[58] Field of Search ............. 250/578; 357/30, 24 LR; 29/576 J

[56] References Cited

U.S. PATENT DOCUMENTS

| | | | |
|---|---|---|---|
| 3,748,479 | 7/1973 | Lehovec | 250/578 |
| 4,067,104 | 1/1978 | Tracy | 29/626 |
| 4,169,273 | 9/1979 | Hendrickson | 357/24 LR |
| 4,196,508 | 4/1980 | Lorenze, Jr. | 29/576 J |
| 4,369,458 | 1/1983 | Thomas et al. | 357/24 LR |
| 4,403,238 | 9/1983 | Clark | 357/30 |
| 4,451,842 | 5/1984 | Pommerrenig | 357/30 |

FOREIGN PATENT DOCUMENTS 2303439  7/1974  Fed. Rep. of Germany ...... 250/578

Primary Examiner—Gene Z. Rubinson
Assistant Examiner—Stephen Brinich
Attorney, Agent, or Firm—H. Fredrick Hamann; Craig O. Malin

[57] ABSTRACT

Disclosed is an integrated processor assembly and a method for making that assembly, including the steps of providing a semiconducting substrate, fabricating integrated processing circuitry in the substrate, depositing a plurality of input strip lines from a first edge of the substrate to the circuitry, depositing a plurality of output leads from the circuitry to a second edge of the substrate, repeating these steps for a plurality of substrates, and bonding the substrates together so that the terminated input strip lines define a two dimensional array of contact points.

3 Claims, 1 Drawing Figure

INTEGRATED PROCESSOR BOARD ASSEMBLY

BACKGROUND OF THE INVENTION

This invention relates to the field of electronic devices and, more particularly, to electronic processing circuitry.

In optical-electronic systems, a detector array is commonly employed in an optical receiver to detect light from an optical beam containing encoded information or to image a scene which is to be displayed. A typical array consists of a two-dimensional matrix of light sensitive diodes. In an optical receiver, the signals generated by these diodes must be electronically conditioned and processed in order to obtain the desired information from the signals. A hybrid type of structure has previously been used for this purpose, with a board assembly providing the necessary interconnections between the detector array and a separate electronic processing chip, as well as providing structural support for the array and establishing a thermal path for cooling the array. Those hybrid systems which have been used in the prior art, however, were generally larger than desirable as well as being expensive and time consuming to manufacture.

Therefore, it would be desirable to provide a processor board assembly which is compact and cost effective in terms of assembly and materials cost.

It would further be desirable to provide a processor board assembly which would support a detector array and also include the necessary processing electronics for the array.

SUMMARY OF THE INVENTION

It is a general object of this invention to provide an improved electronic processor board assembly.

An integrated processor board for a processor assembly, according to the present invention, includes a semiconducting substrate, integrated processing circuitry fabricated in the substrate, a plurality of input strip lines deposited on the substrate, the lines being coupled to the circuitry and terminated at a first edge of the substrate, and a plurality of output leads deposited on the substrate, the leads being coupled to the circuitry and terminated at a second edge of the substrate.

In a more particular embodiment, the processing circuitry further includes a plurality of AC coupling circuits connected to the input strip lines, a charge coupled device multiplexing and processing array receiving the outputs of the coupling circuits, and a two-dimensional CCD processing array receiving the outputs of said multiplexing and processing array and connected to the output leads.

An integrated processor assembly includes, according to the present invention, a plurality of adjoining processor boards, each board including a semiconducting substrate, integrated processing circuitry fabricated in the substrate, a plurality of input strip lines deposited on the substrate, the lines being coupled to the circuitry and terminated at a first edge of the substrate, and a plurality of output leads deposited on the substrate, the leads being coupled to the circuitry and terminated at a second edge of the substrate. The processor assembly further includes an adhesive layer bonding each processor board to the adjoining board, a substrate backing affixed to an outermost one of the processor boards to provide support for the processor assembly, a plurality of beam leads projecting from the second edge of each substrate, one of the beam leads being affixed to each output lead on each substrate, and a plurality of multiple conductor flexible cables, one of the cables being connected to the beam leads from each substrate.

An optical receiver, according to the present invention, includes a two-dimensional array of detector elements, a plurality of adjoining processor boards, each board including a semiconducting substrate, integrated processing circuitry fabricated in the substrate, a plurality of input strip lines deposited on the substrate, and a plurality of output leads deposited on the substrate, the receiver further including an array of electrically conductive flexible columns connecting each of the detector elements to a corresponding one of the input strip lines.

A method of making an integrated processor assembly, according to the present invention, includes the steps of:

(A) providing a semiconducting substrate,
(B) fabricating integrated processing circuitry in the substrate,
(C) depositing a plurality of input strip lines from a first edge of the substrate to the circuitry.
(D) depositing a plurality of output leads from the circuitry to a second edge of the substrate,
(E) passivating the active surface of the substrate,
(F) reducing the substrate to a predetermined thickness,
(G) repeating steps A-F for a plurality of substrates,
(H) bonding the plurality of substrates together, and
(I) smoothing the first edges of the bonded substrates so that the terminated input strip lines define a two-dimensional array of contact points.

These examples of the more important features of the invention have been broadly outlined in order to facilitate an understanding of the detailed description which follows and so that the contributions which this invention provides to the art may be better appreciated. There are, of course, additional features of the invention, which will be further described below and which are included within the subject matter of the appended claims.

BRIEF DESCRIPTION OF THE DRAWING

Additional objects, features, and advantages of the present invention will become apparent by referring to the detailed description of the preferred embodiments in connection with the accompanying drawing. In the drawing.

DESCRIPTION OF THE PREFERRED EMBODIMENT

Figure 1:
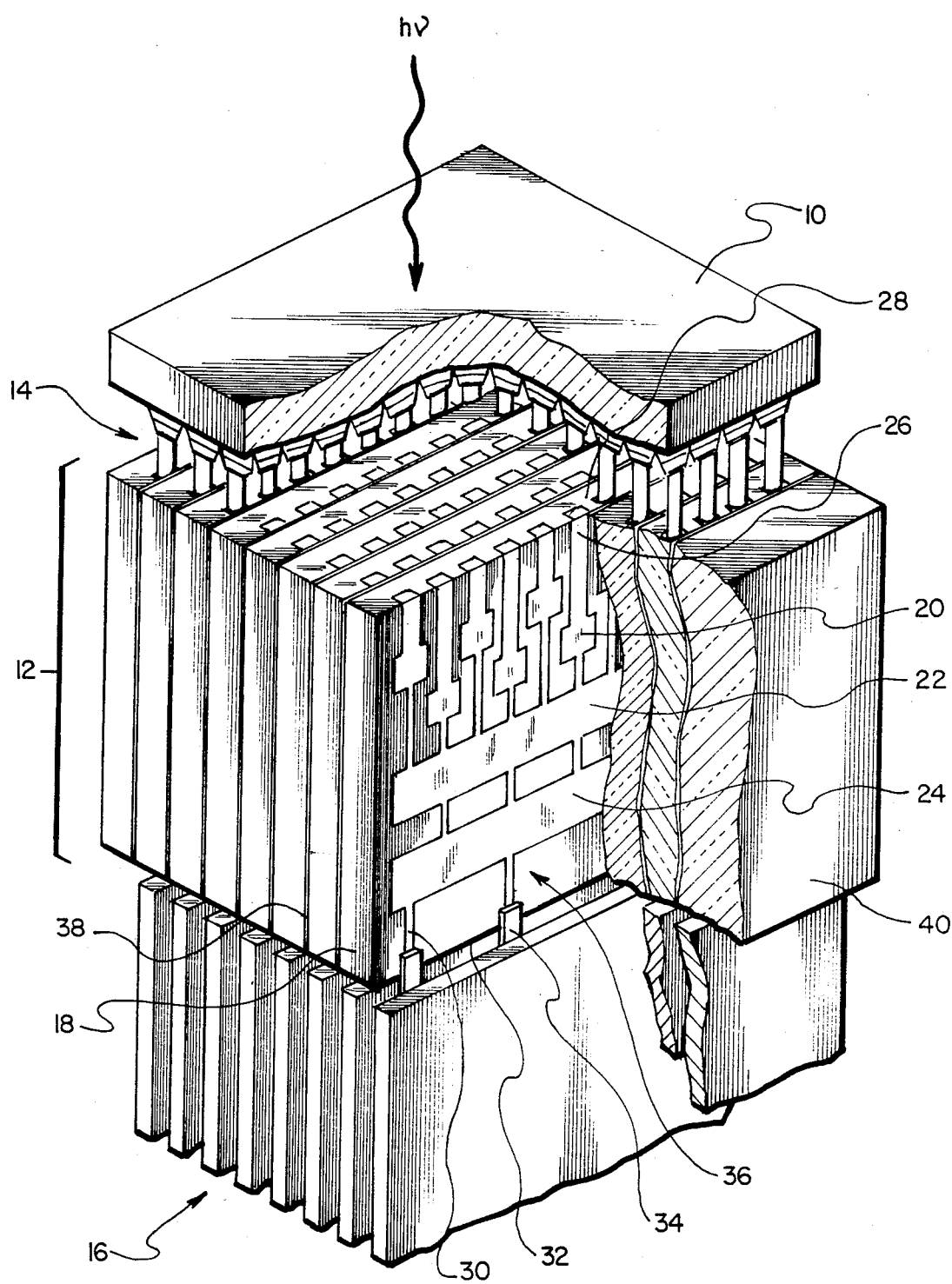
FIG. 1 illustrates an optical receiver in a partially cut away prespective view.

A preferred embodiment of the present invention is utilized in conjunction with a two-dimensional photodiode array to establish an improved optical receiver. FIG. 1 illustrates this embodiment in a partially cut away prespective view.

The optical receiver of FIG. 1 includes a two-dimensional detector array 10, a processor assembly 12, connected to the detector array by an array of flexible columns 14, and a plurality of multiple conductor flexible cables 16, for conveying processed signals from the receiver.

The processor assembly 12, which includes the novel features of the present invention, serves as the mounting surface for the detector array 10, provides a thermal path to a focal plane cooling source, provides an interconnect between the array of detectors and their associated electronics, and also includes, integrated therein, the necessary electronics for processing signals from the array. The integration of these functions into a single unit permits an optical receiver to be built with significant advantages over the prior art in terms of size, performance, and cost.

The optical receiver, including the embodiment of the processor assembly illustrated, is manufactured by beginning with a semiconducting substrate 18. Integrated processing circuitry is then fabricated, by techniques known in the art, in the substrate 18. In the embodiment illustrated in FIG. 1, the processing circuitry includes a plurality of AC coupling circuits 20, a CCD multiplexing and processing array 22, and a two-dimensional CCD processing array 24.

After the processing circuitry is fabricated, input strip lines 26 are deposited to extend from a first edge 28 of the substrate to connect with the inputs of the AC coupling circuits 20.

Next, output leads 30 are deposited so that the leads are connected to the outputs of the two-dimensional CCD processing array and lead to a second edge 32 of the substrate. A beam lead 34 is then affixed to each output lead so that the beams leads project from the second edge 32 of the substrate.

After the processing circuitry, the input strip lines, and the output leads are established, the active surface 36 of the substrate 18 is passivated to protect the processing circuitry, and the thickness of the substrate is reduced an appropriate amount so that the completed processor assembly will match the spacing of the detectors in the detector array 10.

A second semiconducting substrate is then selected and the steps of fabricating processing circuitry, input strip lines, output leads, and beam leads are repeated for that substrate. The second substrate is similarly passivated and reduced to the appropriate thickness. This process is repeated an appropriate number of times, depending on the size of the array to which the completed processor is to be attached. In FIG. 1, for example, the array 10 is a 10×10 element array, so that 10 substrates, each having 10 input strip lines, are required.

The completed individual substrates are then bonded together with a suitable adhesive, such as epoxy. The thickness of each epoxy layer 38 and each substrate is coordinated so that the spacing between the input strip lines 26 on adjacent substrates 18 matches the spacing of the elements in the detector array 10. In this manner, after the substrates are bonded together, the terminated input strip lines at the first edges 28 of the substrates will define a two-dimensional array of contact points for connection to the detector array 10.

The first edges 28 are then polished so that the two-dimensional array of contact points presents a smooth uniform surface. A relatively thick substrate backing 40 is affixed to an outermost one of the processor boards to provide support for the processor assembly 12.

The detector array 10 is connected to the completed processor assembly 12 by joining the detector elements of the array to the input strip lines 26 through the array of flexible columns 14. The manner of construcing such columns and the reasons for their use are explained in detail in U.S. Pat. No. 4,067,104, the teaching of which is incorporated herein by reference.

Finally, a plurality of multiple conductor cables for conveying the processed signals from the detector array are attached to the beam leads 34, which project from the second edge 32 of each substrate to facilitate this attachment.

In summary, a hybrid board structure for coupling a detector to separate processing electronics is avoided by the present invention, which features a completely solid state design for the processing board assembly. Strip lines to an edge of each board contact the detector elements through soft metal posts and are connected to AC coupling circuitry on the board. CCD multiplexor and signal processing electronics receive the outputs of the AC coupling circuits, while a few beam leads projecting off the board are provided for connection to flexible cabling. With this design, the boards can be stacked together, joined with epoxy, and the processing board assembly mated to the detector array. Such an assembly occupies a much smaller volume than do the hybrid structures of existing technology, and further eliminates the costly and time consuming task of assembling the present hybrid structures.

In conclusion, although a typical embodiment of the present invention has been illustrated and discussed above, numerous modifications and alternative embodiments of the apparatus and method of this invention will be apparent to those skilled in the art in view of this description. Accordingly, this description is to be considered as illustrative only and is provided for the purpose of teaching those skilled in the art the manner of constructing the apparatus and performing the method of this invention. Furthermore, it should be understood that the form of the invention depicted and described herein is to be considered as the presently preferred embodiment. Various changes may be made in the configuration, sizes, and arrangements of the components of the invention, as will be recognized by those skilled in the art, without departing from the scope of the invention. Equivalent elements, for example, might be substituted for those illustrated and described herein, parts or connections might be reversed or otherwise interchanged, and certain features of the invention might be utilized independently of the use of other features, all as will be apparent to one skilled in the art after receiving the benefit attained through reading the above description of the invention.

What is claimed is:

1. An integrated processor assembly, comprising:
    a plurality of adjoining processor boards, each board including:
    a semiconducting substrate;
    integrated processing circuitry fabricated in said substrate;
    a plurality of input strip lines deposited on said substrate, said lines being coupled to said circuitry and terminated at a first edge of said substrate, such that said first edges of each substrate together define a plane, the strip lines terminated thereon defining a two dimensional array;
    a plurality of output leads deposited on said substrate, said leads being coupled to said circuitry and terminated at a second edge of said substrate;
    a plurality of beam leads projecting from the second edge of each substrate, one of said beam leads being affixed to each output lead on each substrate;
    an adhesive layer binding each processor board to the adjoining processor board;

a substrate backing affixed to an outermost one of said processor boards to provide support for said processor assembly; and a plurality of multiple conductor flexible cables, one of said cables being connected to the beam leads from each substrate.

2. An optical receiver, comprising:

a two dimensional array of detector elements;

a plurality of adjoining processor boards, each board including:

a semiconducting substrate;

integrated processing circuitry fabricated in said substrate;

a plurality of input strip lines deposited on said substrate, said lines being coupled to said circuitry and terminated at a first edge of said substrate;

a plurality of output leads deposited on said substrate, said leads being coupled to said circuitry and terminated at a second edge of said substrate;

a plurality of beam leads projecting from the second edge of each substrate, one of said beam leads being affixed to each output lead on each substrate;

an adhesive layer binding each processor board to the adjoining processor board;

a substrate backing affixed to an outermost one of said processor boards to provide support for said processor boards;

an array of electrically conductive flexible columns connecting each of said detector elements to a corresponding one of said input strip lines; and a plurality of multiple conductor flexible cables, one of said cables being connected to the beam leads from each substrate.

3. A method of making an integrated processor assembly, comprising the steps of:

(a) providing a semiconducting substrate;

(b) fabricating integrated processing circuitry in the substrate;

(c) depositing a plurality of input strip lines from a first edge of the substrate to the circuitry;

(d) depositing a plurality of output leads from the circuitry to a second edge of the substrate;

(e) affixing a beam lead to each output lead so that the beam leads project from the second edge of each substrate;

(f) repeating steps (a) - (e) for a plurality of substrates;

(g) affixing a substrate backing to an outermost one of the processor boards to provide support for the processor assembly;

(h) bonding the substrates together so that the terminated input strip lines define a two dimensional array of contact points; and (i) connecting a multiple conductor flexible cable to the beam leads from each substrate.

* * * * *